(12) United States Patent
Tsai

(10) Patent No.: US 8,013,518 B2
(45) Date of Patent: Sep. 6, 2011

(54) TOP-EMITTING ORGANIC LIGHT EMITTING DIODE STRUCTURES AND FABRICATION METHOD THEREOF

(75) Inventor: Tze-Chien Tsai, Sijhih (TW)

(73) Assignee: Au Optronics Corp., Hsinchu (TW)

( * ) Notice: Subject to any disclaimer, the term of this patent is extended or adjusted under 35 U.S.C. 154(b) by 1834 days.

(21) Appl. No.: 11/002,831

(22) Filed: Dec. 1, 2004

(65) Prior Publication Data
US 2006/0028132 A1  Feb. 9, 2006

(30) Foreign Application Priority Data
Aug. 3, 2004 (TW) ................ 93123200 A

(51) Int. Cl.
*H01L 51/00* (2006.01)
(52) U.S. Cl. ..................... 313/504; 313/509
(58) Field of Classification Search .......... 313/495–512; 315/169.3, 169.4; 257/40, 79; 428/690; 345/30, 36, 44, 45
See application file for complete search history.

(56) References Cited

U.S. PATENT DOCUMENTS

| | | | |
|---|---|---|---|
| 4,769,292 A | 9/1988 | Tang et al. | 428/690 |
| 5,115,442 A | 5/1992 | Lee et al. | 372/45 |
| 5,935,721 A | 8/1999 | Shi et al. | 428/690 |
| 6,069,443 A * | 5/2000 | Jones et al. | 313/504 |
| 6,366,017 B1 | 4/2002 | Antoniadis et al. | 313/506 |
| 6,436,788 B1 * | 8/2002 | Lee et al. | 438/414 |
| 6,506,616 B1 * | 1/2003 | Kim et al. | 438/22 |
| 6,670,772 B1 | 12/2003 | Arnold et al. | 315/169.3 |
| 7,091,659 B2 * | 8/2006 | Fuchigami et al. | 313/509 |
| 2002/0025391 A1 * | 2/2002 | Angelopoulos et al. | 428/1.4 |
| 2002/0180721 A1 * | 12/2002 | Kimura et al. | 345/211 |
| 2003/0127974 A1 * | 7/2003 | Miyazawa | 313/504 |
| 2004/0251841 A1 * | 12/2004 | Negishi et al. | 315/169.3 |

* cited by examiner

Primary Examiner — Karabi Guharay
(74) Attorney, Agent, or Firm — Thomas|Kayden

(57) ABSTRACT

Top-emitting organic light emitting diode (OLED) structures and fabrication method thereof. A first electrode is formed on a substrate. A dielectric layer including at least one first opening is formed on the first electrode. An organic emission layer is formed on the dielectric layer and fills the first opening. A second electrode including at least one second opening is formed on the organic emission layer. The second opening corresponds to the first opening.

17 Claims, 1 Drawing Sheet

TOP-EMITTING ORGANIC LIGHT EMITTING DIODE STRUCTURES AND FABRICATION METHOD THEREOF

BACKGROUND

The present invention relates to organic light emitting diode (OLED) structures, and more particularly, to top-emitting OLED structures comprising an emitting aperture.

Organic light emitting diode (OLED) devices are useful in a variety of applications such as watches, telephones, notebook computers, pagers, cell phones, calculators and the like. Conventional OLED structures are built on glass substrates in a manner such that a two-dimensional OLED array for image presentation is formed. Each OLED structure typically comprises an anode, a cathode and an organic emission layer interposed therebetween. When an electrical potential is present across the electrodes, holes and electrons are injected into the organic emission layer from the anode and the cathode, respectively. Light emission results from hole-electron recombination within the structure.

OLED structures are classified into two types, bottom-emitting and top-emitting. In an active matrix type OLED device, light generated from the bottom-emitting OLED structure, however, cannot penetrate the regions where TFTs (thin film transistors) and wirings are formed on a lower substrate, seriously reducing aperture ratio. Thus, top-emitting OLED structures are well suited for active matrix type OLED devices.

FIG. 1 is a sectional view of a conventional top-emitting OLED structure 100. A reflective electrode 120, serving as an anode, is formed on a substrate 110. The reflective electrode 120 can be an aluminum or silver layer. An organic emission layer 130 is formed on the reflective layer 120. A transparent metal layer 140, serving as a cathode, is formed on the organic emission layer 130. Note that the transparent metal layer 140 must be very thin (thinner than 50 Å) in order to be light transmissive. This, however, results in increased resistance of the metal layer 140 and decreases electron mobility and device performance. Additionally, the metal layer 140 absorbs some of the light output from the organic emission layer 130, thereby decreasing light emission efficiency. Moreover, the metal layer 140 reflects some of the emitted light, decreasing light emission efficiency due to the microcavity effect.

U.S. Pat. No. 6,670,772 to Arnold et al., the entirety of which is hereby incorporated by reference, describes a top-emitting OLED device comprising grating electrodes. The grating electrodes are employed to improve the light output of the disclosed OLED device.

U.S. Pat. No. 6,366,017 to Antoniadis et al., the entirety of which is hereby incorporated by reference, describes a top-emitting OLED device. In the disclosed OLED device, a distributed Bragg reflector is disposed on a cathode to increase brightness.

U.S. Pat. No. 5,115,442 to Lee et al., the entirety of which is hereby incorporated by reference, describes a top-emitting laser structure. In the laser structure, ion implantation is performed, creating an active region thus forming a resistance gradient therein. The resistance gradient causes an aperture in the laser structure.

SUMMARY

Top-emitting OLED structures are provided. An exemplary embodiment of a top-emitting OLED structure comprises a first electrode serving as an anode formed on a substrate. A dielectric layer comprising at least one first opening is formed on the first electrode. An organic emission layer is formed on the dielectric layer and fills the first opening. A second electrode comprising at least one second opening is formed on the organic emission layer. The second electrode serves a cathode. The second opening corresponds to the first opening.

The dielectric layer comprising a first opening is formed on the first electrode (i.e. anode). The organic emissionlayer is formed on the dielectric layer and fills the first opening. The second electrode (i.e. cathode) comprising a second opening is formed on the organic emission layer, wherein the second opening corresponds to the first opening. The thickness of the cathode can thus be increased to reduce resistance thereof. Additionally, the electron flow from the cathode can be collectively induced in the organic emission layer in the first opening, increasing current density and light emission efficiency.

DESCRIPTION OF THE DRAWINGS

Top-emitting OLED structures will become more fully understood from the detailed description given in the following and the accompanying drawings, given by way of illustration only and thus not intended to be limitative, and wherein.

DETAILED DESCRIPTION

Figure 1:
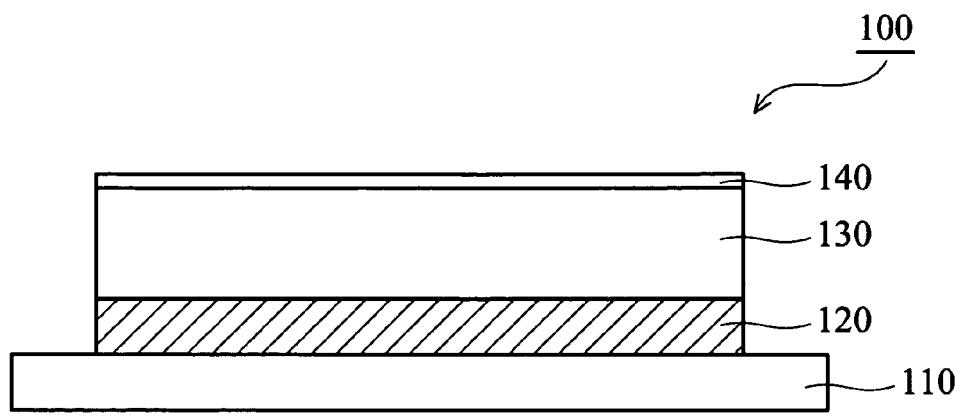
FIG. 1 is a sectional view of a conventional top-emitting OLED structure.

Top-emitting OLED structures are provided. An exemplary embodiment of a top-emitting OLED structure, shown in FIG. 2, comprises a first electrode 220 serving as an anode 220 disposed on a substrate 210. The substrate 210 can be a thin film transistor (TFT) array substrate. The anode 220 is a reflective layer with a high work function, for example, greater than about 4 eV. The reflective layer can be a metal layer comprising Pt, Pd, Ir, Au, W, Ni, Ag and/or Al formed by evaporation or sputtering.

Depending on different designs, a hole-injecting layer 230 and a hole-transporting layer 240 can sequentially overlie the anode 220. The hole-injecting layer 230 and the hole-transporting layer 240 can be formed by vacuum evaporation. The hole-injecting material can be, for example, m-MTDATA (4,4',4''-tris[N-(3-methylphenyl)-N-phenylamino]triphenylamine). The hole-transporting material can be, for example, NPB (4-4'-bis[N-(1-naphthyl)-N-phenylamino]-biphenyl).

Figure 2:
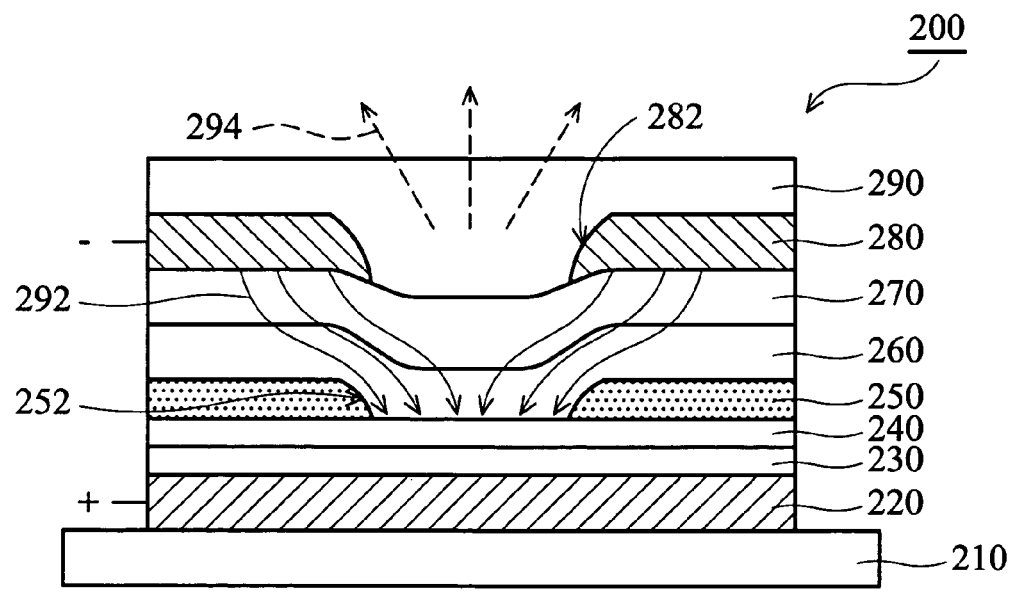
FIG. 2 is a sectional view of an embodiment of a top-emitting OLED structure.

A dielectric layer 250 comprising at least one first opening 252 overlies the hole-transporting layer 240. The dielectric layer 250 can be an insulating layer comprising silicon oxide and/or silicon nitride formed by deposition and patterning. In order to form the first opening 252 with sidewall slopes shown in FIG. 2, isotropic etching (e.g. wet etching) is preferably employed during patterning.

A conformal organic emission layer 260 is disposed overlying the dielectric layer 250 and fills the first opening 252. The organic emission layer 260 can be formed by vacuum evaporation. The organic emission material typically comprises doped organic material. The organic emission materials are described in, for example, U.S. Pat. Nos. 4,769,292, 5,935,721, 6,670,772 and other references. In order to avoid obscuring aspects of the disclosure, detailed organic emission materials are not described here again.

Depending on different designs, an electron-transporting layer 270 can overlie the organic emission layer 260. The electron-transporting layer 270 can be formed by vacuum evaporation. The electron-transporting material can be, for example, Alq (aluminiferous complex compound).

A second electrode 280 serving as a cathode 280 is disposed on the organic emission layer 260. The cathode 280 comprises at least one second opening 282 corresponding to the first opening 252. The cathode 280 can be an opaque metal layer comprising Al, Au or Pt formed by deposition (e.g. evaporation or sputtering) and patterning. In order to form the second opening 282 with sidewall slopes, isotropic etching (e.g. wet etching) is preferably employed during patterning. The opening area of the second opening 282 can be less than that of the first opening 252, thereby concentrating the emitted light 294 from the organic emission layer 260 to increase radiation energy. Since the emitted light 294 can be scattered through the second opening 282, the thickness of the cathode 280 can be increased to a desired thickness (e.g. greater than 1000 .ANG.). This decreases cathode resistance, improving electron mobility and device performance.

In order to prevent erosion due to moisture, a protective layer 290 can overlie the cathode 280 and the second opening 282. The protective layer 290 can be an insulating layer comprising silicon oxide and/or silicon nitride formed by deposition or coating.

An operational example of this embodiment is illustrated hereinafter. When a voltage is applied between the anode 220 and the cathode 280, a concentrated electron flow 292 from the cathode 280 is introduced to the organic emission layer 260 to combine with holes from the anode 220 in the first opening 252, resulting in light emission 294 within the structure. Current density can be thus increased to enhance light emission efficiency. Additionally, the emitted light 294 can be collectively irradiated through the second opening which serves as an optical aperture, thereby increasing radiation energy and light transmittance without microcavity issue.

While the invention has been described by way of example and in terms of preferred embodiment, it is to be understood that the invention is not limited thereto. On the contrary, it is intended to cover various modifications and similar arrangements as would be apparent to those skilled in the art. Therefore, the scope of the appended claims should be accorded the broadest interpretation so as to encompass all such modifications and similar arrangements.

What is claimed is:

1. A top-emitting organic light emitting diode (OLED) structure, comprising:
    a substrate;
    a first electrode formed on the substrate;
    a dielectric layer comprising at least one first opening formed on the first electrode;
    an organic emission layer formed on the dielectric layer filling in the first opening; an electron-transporting layer overlying the organic emission layer; and
    a second electrode comprising at least one second opening, wherein the second opening at least exposes a portion of the electron-transporting layer.

2. The OLED structure according to claim 1, further comprising a protective layer covering the second electrode and the second opening.

3. The OLED structure according to claim 1, wherein the substrate is a thin film transistor array substrate.

4. The OLED structure according to claim 1, the first electrode is a reflective metal layer serving as an anode.

5. The OLED structure according to claim 4, further comprising a hole-injecting layer and a hole-transporting layer interposed between the reflective metal layer and the dielectric layer.

6. The OLED structure according to claim 1, wherein the dielectric layer comprises silicon oxide and/or silicon nitride.

7. The OLED structure according to claim 1, wherein the second electrode is an opaque metal layer serving as a cathode.

8. The OLED structure according to claim 7, wherein the electron-transporting layer is interposed between the opaque metal layer and the organic emission layer.

9. The OLED structure according to claim 1, wherein an opening area of the second opening is less than that of the first opening.

10. A method of forming a top-emitting organic light emitting diode (OLED) structure, comprising:
    forming a first electrode formed on a substrate;
    forming a dielectric layer comprising at least one first opening on the first electrode;
    forming an organic emission layer on the dielectric layer to fill the first opening;
    forming an electron-transporting layer on the organic emission layer; and
    forming a second electrode comprising at least one second opening on the electron-transporting layer, wherein the second opening at least exposes a portion of the electron-transporting layer on the organic emission layer.

11. The method according to claim 10, further comprising forming a protective layer covering the second electrode and the second opening.

12. The method according to claim 10, wherein the substrate is a thin film transistor array substrate.

13. The method according to claim 10, the first electrode is a reflective metal layer serving as an anode.

14. The method according to claim 13, further comprising forming a hole-injecting layer and a hole-transporting layer between the reflective metal layer and the dielectric layer.

15. The method according to claim 10, wherein the dielectric layer comprises silicon oxide and/or silicon nitride.

16. The method according to claim 10, wherein the second electrode is an opaque metal layer serving as a cathode.

17. The method according to claim 10, wherein an opening area of the second opening is less than that of the first opening.

* * * * *